(12) United States Patent
Klopfer (10) Patent No.: US 7,843,200 B2
(45) Date of Patent: Nov. 30, 2010

(54) CAPACITIVE PROXIMITY SWITCH AND DOMESTIC APPLIANCE EQUIPPED THEREWITH

(75) Inventor: Wilfried Klopfer, Regensburg (DE)

(73) Assignee: BSH Bosch und Siemens Hausgeraete GmbH, Munich (DE)

( * ) Notice: Subject to any disclaimer, the term of this patent is extended or adjusted under 35 U.S.C. 154(b) by 260 days.

(21) Appl. No.: 12/065,408

(22) PCT Filed: Aug. 14, 2006

(86) PCT No.: PCT/EP2006/065281

§ 371 (c)(1),
(2), (4) Date: Feb. 29, 2008

(87) PCT Pub. No.: WO2007/025851

PCT Pub. Date: Mar. 8, 2007

(65) Prior Publication Data

US 2008/0238444 A1    Oct. 2, 2008

(30) Foreign Application Priority Data

Aug. 30, 2005  (DE) .................. 10 2005 041 113

(51) Int. Cl.
  *G01R 27/26*  (2006.01)
(52) U.S. Cl. ...................... 324/662; 324/686
(58) Field of Classification Search .......... 324/662,
  324/658, 649, 686, 671, 548, 661, 415–424,
  324/699, 635, 644; 340/562, 541, 686.6,
  340/545.4; 361/1, 42, 179; 73/1.79, 780,
  73/718, 724, 862.337, 862.626, 514.32, 862.37;
  702/47, 52, 150
See application file for complete search history.

(56) References Cited

U.S. PATENT DOCUMENTS

| | | | |
|---|---|---|---|
| 4,339,709 A * | 7/1982 | Brihier | 324/725 |
| 4,733,222 A | 3/1988 | Evans | |
| 5,572,205 A | 11/1996 | Caldwell et al. | |
| 5,757,196 A | 5/1998 | Wetzel | |
| 5,973,417 A * | 10/1999 | Goetz et al. | 307/129 |
| 6,518,820 B2 | 2/2003 | Gremm | |
| 6,667,563 B2 * | 12/2003 | Bae et al. | 307/112 |
| 6,954,867 B2 * | 10/2005 | Casebolt et al. | 713/323 |
| 7,196,528 B2 * | 3/2007 | Ebihara | 324/686 |
| 7,208,961 B2 * | 4/2007 | Miyasaka | 324/686 |
| 2005/0179673 A1 | 8/2005 | Philipp | |
| 2006/0238233 A1 | 10/2006 | Kraus | |

FOREIGN PATENT DOCUMENTS

DE    4006119 A1    8/1991

(Continued)

*Primary Examiner*—Hoai-An D Nguyen
(74) *Attorney, Agent, or Firm*—Laurence A. Greenberg; Werner H. Stemer; Ralph E. Locher (57) ABSTRACT

A capacitive proximity switch has an electrically conductive sensor surface, which is covered by an electrically non-conductive covering plate and which serves as a part of a capacitor having a capacitance that varies with proximity. The sensor surface is connected to a control input of a semiconductor switch that has a signal input with a clock signal and a signal output. A household appliance is equipped with the capacitive proximity switch. The signal output of the semiconductor switch has an output signal, which follows the clock signal and which has signal portions that are proportional to the capacitance of the capacitor formed with the sensor surface.

48 Claims, 8 Drawing Sheets

FOREIGN PATENT DOCUMENTS

| | | |
|---|---|---|
| DE | 69702958 T2 | 5/2001 |
| DE | 10005173 A1 | 8/2001 |
| DE | 10303480 A1 | 8/2004 |
| DE | 202005002157 U1 | 5/2005 |
| EP | 0766398 A1 | 4/1997 |
| EP | 1204209 A1 | 5/2002 |
| EP | 1298803 A2 | 4/2003 |
| GB | 1528668 | 10/1978 |
| WO | 0052657 A1 | 9/2000 |

\* cited by examiner

CAPACITIVE PROXIMITY SWITCH AND DOMESTIC APPLIANCE EQUIPPED THEREWITH

The invention relates to a capacitive proximity switch having an electrically conducting sensor surface which is covered by an electrically insulating cover plate and serves as part of a capacitor having a capacitance which varies as a function of proximity, from which the sensor surface is connected to a control input of a semiconductor switch which additionally has a signal input having a clock signal and a signal output, and to a domestic appliance equipped with a proximity switch of said kind.

Numerous devices employing capacitive sensors or switches are known. The present invention relates to a specific design of capacitively operating switches wherein an electrically conductive sensor surface is covered by an electrically insulating cover plate. Thus, a user does not touch the sensor surface directly but merely comes closer to said surface when touching the cover plate. The sensor surface forms one plate of an open capacitor, the capacitance of which is dependent on the distance from a second plate (e.g. ground), which distance is varied for example by proximity of the user's finger.

A capacitive proximity switch of this kind is known already from DE 695 19 701 T2. There, a semiconductor switch is provided, the signal input of which is supplied with an input signal in the form of a sequence of polarized pulses and which, in the idle state, i.e. when the proximity switch is not actuated, is in a blocking state, such that no output signal is present at the signal output of the semiconductor switch. However, a proximity switch of said kind has the disadvantage that an actuation by the user cannot be unequivocally distinguished from an operating error due, for example, to soiling of the cover plate.

The object underlying the present invention is therefore to provide an improved, economical capacitive proximity switch.

In the case of a capacitive proximity switch of the type referred to in the introduction, the aforementioned object is achieved according to the invention in that the signal output of the semiconductor switch has an output signal following the clock signal and having signal components that are proportional to the capacitance of the capacitor formed by means of the sensor surface.

The invention brings with it the advantage that the output signal is available with each clock of the clock signal and consequently changes in the capacitance of the capacitor formed by means of the sensor surface can be evaluated at any time. In this way it is possible, in particular through evaluation of a change over time, to establish whether the change in capacitance is due to an actuation of the proximity switch by a user, or whether an operating error due to moisture or soiling on the cover plate is present.

According to a preferred embodiment the control input is configured to supply the sensor surface with the clock signal, and during a charging-up period of the capacitor by means of the clock signal the output signal is present at the signal output of the semiconductor switch. In particular the semiconductor switch has a transistor, and the sensor surface is connected to the base of the transistor. Since the semiconductor switch or transistor connects through as long as charge carriers flow onto the sensor surface, the shape of the output signal is dependent on the capacitance of the capacitor and as a result a measurement of said capacitance is easily made possible.

Preferably the signal input for supplying with the clock signal is connected to an output of a microprocessor. Said output may be an analog output or a digital output, such as for example a timer output, a PWM output or an I/O output. The clock signal, which is output in particular from the output of the microprocessor, is advantageously a periodic clock signal, in particular a square wave signal, and has a frequency preferably in the range from 10 to 100 kilohertz. This ensures an adequate interrogation frequency of the capacitance of the capacitor formed by means of the sensor surface for the purpose of detecting an actuation of the proximity switch. Furthermore, an expensive, separate frequency generator for generating the clock signal can be dispensed with, thereby reducing the number of components necessary. In particular the frequency of the clock signal is automatically variable. This enables the frequency at which the output signal has a maximum signal deviation to be selected automatically. Preferably the clock signal is applied cyclically at the signal input for a predefined period of time in each case. In this way it can be checked at defined time intervals whether an actuation of the proximity switch is present. The intervening periods can be used for other functions, in particular by the microprocessor.

For the purpose of processing the output signals the signal output of the semiconductor switch is connected for example to an integrator circuit or a peak-reading voltmeter or, according to a preferred embodiment, to a sample-and-hold circuit. When the integrator circuit is used, a plurality of pulses of the output signal can be integrated up into a dc voltage. The height of the output signal pulses can be determined directly by means of the peak-reading voltmeter. By means of the sample-and-hold circuit, a dc voltage signal proportional to the amplitude of the pulse peaks of the output signal can be made available for further processing.

Advantageously, the signal output of the semiconductor switch is connected for the purpose of evaluating the output signal to an analog input of a microprocessor, in particular via the intermediately connected sample-and-hold circuit. In this way an evaluation of the output signal by a software program is possible, and no threshold circuit is necessary for this, as a result of which the number of components is reduced further.

The microprocessor is embodied for evaluating a change over time of signal components of the output signal, with the aid of a software program for example. An actuation of the proximity switch 4 is detected by the microprocessor as a function of how quickly the signal components of the output signal, such as the height of the pulse peak or the pulse width for example, of successive clock periods change. That is to say if the signal components change within a predefined time of one second for example, this is detected as an actuation, while if the signal components change more slowly, there is no actuation present. By this means, the determination of an actuation of the proximity switch is independent of the absolute value of the output signal, which eliminates long-term changes thereof, e.g. due to aging processes.

According to the invention the sensor surface has active screening. The active screening is formed by means of a screening surface at which the clock signal is present at the same time as at the sensor surface. If the sensor surface and the screening surface lying adjacent to the sensor surface are supplied simultaneously with a maximally identical or the same clock signal, this brings with it the advantage that there is no difference in potential between the sensor surface and the screening surface, thus resulting in no charge shift and therefore to no capacitive influencing of the sensor surface. This is important in particular in the case of capacitances of the capacitor formed by means of the sensor surface that are in the order of magnitude of picofarads, since in this range even small parasitic capacitances of, for example, lines, adjacent sensor surfaces or metal housings affect a measurement of the capacitor's capacitance. By minimizing the effect of said parasitic capacitances on the sensor surface with the aid of the active screening it is possible to arrange the proximity switch in the vicinity of metallic housing parts even if the latter are grounded. Furthermore, it is now no longer necessary to place the sensor surface in immediate proximity to the evaluation electronics of the proximity switch in order to minimize parasitic capacitances, but instead the sensor surface can be arranged together with the screening surface at a distance from the evaluation electronics. By this means it becomes possible to implement the sensor surface and the connecting lines in the form of a low-cost copper-clad polyester film which has a connection to the evaluation electronics.

Preferably the clock signal is applied at the screening surface via a low-impedance resistor. In this way the signal shape of the clock signal at the screening surface can be matched to the signal shape of the clock signal at the sensor surface.

According to a preferred embodiment, the screening surface can be connected to ground for the purpose of applying ground potential by way of a switch, with ground in this context being understood as a fixed potential, such as, for example, ground potential or a reference potential of the proximity switch. In order to test the proper functioning of the proximity switch, i.e. in order to ascertain a reference value of the output signal, the screening surface can be temporarily connected to ground by the switch, as a result of which the active screening is temporarily disabled and an actuation of the proximity switch is simulated. By this means it is possible to check whether there is a sufficient deviation of the output signal upon actuation of the proximity switch or whether there is a malfunction, possibly due to contamination or wetting of the cover plate or due to aging processes of the proximity switch. In this way operator errors during use of the proximity switch can be avoided, thereby improving the functional reliability of the proximity switch. In particular an appliance equipped with the proximity switch according to the invention can be switched off automatically if reliable operation of the proximity switch is no longer assured. The deviation of the output signal can possibly be adjusted dynamically by changing the height of the clock signal, i.e. the proximity switch can be calibrated automatically.

Advantageously the switch has a control signal input which is connected to a control signal output of a microprocessor. In particular, the switch is a transistor, such as e.g. a PNP or NPN bipolar transistor, the base of which is connected to the control signal output of the microprocessor. Thus, the switch or transistor can be switched in a simple manner by means of a software program via the microprocessor, thereby enabling an automatic function test of the proximity switch to be carried out at predefined times.

Depending on application situation, the screening surface and the sensor surface can be arranged differently. For example, the screening surface and the sensor surface are mounted on the rear side of the cover plate, with the screening surface enclosing the sensor surface. In particular the screening surface and the sensor surface may be vapor-deposited or adhesively attached or printed onto the rear side of the cover plate. Alternatively thereto, the screening surface and the sensor surface are arranged on the same side of a substrate, with the screening surface likewise enclosing the sensor surface.

In a further embodiment the sensor surface is arranged on the front side of a substrate and the screening surface on the rear side of the substrate at least in the area of the sensor surface. In this way the sensor surface can be screened off from power electronics arranged toward the rear, in particular in the case of a household appliance, such as, for example, a washing machine, a laundry dryer, a dishwasher, a cooking appliance, a fume extractor hood, a refrigeration appliance, an air-conditioning appliance, a water heater or a vacuum cleaner. In particular the substrate is a printed circuit board which has a partial area of the front side as a sensor surface and the entire rear side of which is embodied as a screening surface.

According to a preferred embodiment the substrate is arranged at a distance from the cover plate, and disposed between cover plate and substrate is an electrically conductive body which spans the distance and is connected to the sensor surface in an electrically conductive manner and/or which forms at least a part of the sensor surface with at least a part of its surface. The electrically conductive body causes the sensor-related detector property of the sensor surface to be displaced from the substrate to the rear side of the cover plate. The screening surface is insulated by means of the air layer between the substrate and the cover plate against changes in charge at the front side of the cover plate, in particular in the case of touching by a user.

In another embodiment the substrate is a flexible printed circuit board or a copper-clad plastic film. A substrate of this kind can be adapted to cover plates having the most varied curvatures, such that the sensor surface is in contact with the rear side of the cover plate in a form-fitting manner. In particular a substrate of this kind can be pressed onto or adhesively attached to the rear side of the cover plate.

According to the invention the proximity switch has a reference sensor surface for the purpose of generating a reference signal for determining an actuation state of the proximity switch, with signal components of the reference signal being proportional to the capacitance of a reference capacitor formed by means of the reference sensor surface, and with the capacitance of the reference capacitor being determined by ambient conditions of the sensor surface. This brings with it the advantage that the influence of ambient conditions such as for example humidity, temperature, or increases and decreases in temperature over time, but also the influence of changes in materials due to aging, on the output signal of the sensor surface is determined by the reference signal and can be taken into account in the evaluation of the output signal, which is proportional to the capacitance of the capacitor formed by means of the sensor surface. A further advantage consists in the fact that in the case of appliances that are switched on with a power switch, it is possible to establish by means of the reference signal as early as when switching on whether an actuation of the proximity switch is present. Overall, plausibility queries in the evaluation of the output signal can be reduced by means of the reference signal.

Preferably the reference sensor surface and the sensor surface are arranged on a common substrate, in particular on the same side of the substrate. The spatial proximity of the reference sensor surface to the sensor surface ensures that the reference signal represents the parasitic capacitances of the sensor surface.

According to a preferred embodiment, the substrate is arranged at a distance from the cover plate and an electrically conductive body is arranged between the cover plate and the substrate, which body spans the distance and which is connected to the sensor surface in an electrically conductive manner and/or which forms a part of the sensor surface with at least a part of its surface. The electrically conductive body causes the sensor-related detector property of the sensor surface to be displaced from the substrate to the rear side of the cover plate. The reference sensor surface is insulated by means of the air layer between the substrate and the cover plate against changes in charge at the front side of the cover plate, in particular in the case of touching by a user, so that an intentional or unintentional actuation of the reference sensor surface by the user is prevented.

Beneficially, the clock signal is present at the sensor surface and a further clock signal or the same clock signal at the reference sensor surface. By this means, the capacitance of the reference sensor surface can be determined analogously to the capacitance of the capacitor formed by means of the sensor surface, and the reference signal can be processed analogously to its output signal.

Preferably, the clock signal is present at the sensor surface and at the reference sensor surface in a time-division multiplex method. The high frequency of the clock signal ensures a sufficient interrogation frequency of the capacitances of the capacitor formed by means of the sensor surface and of the reference capacitor for the purpose of detecting an actuation of the proximity switch. The use of only one clock signal has the advantage that only one clock signal generator is needed. The reference signal is taken into account in a simple manner by means of a software program of the microprocessor during the determination of an actuation state of the proximity switch.

In the preferred embodiment, in which the substrate is arranged at a distance from the cover plate and an electrically conductive body is arranged between the cover plate and the substrate, which body spans the distance and which is connected to the sensor surface in an electrically conductive manner and/or which forms at least a part of the sensor surface with at least a part of its surface, it has proved particularly favorable to arrange at least one electronic component on the substrate in such a way that it protrudes into a cavity which is enclosed by the electrically conductive body. Together with a screening surface arranged on the rear side of the printed circuit board in particular, the electrically conductive body, which is in particular a compression spring wound out of a stretched body, forms a kind of Faraday cage for the electronic component so that the said component is screened against electromagnetic interference signals from the environment. Preferably, by this means, the semiconductor switch is arranged on the substrate and screened against electromagnetic interference signals so that the quality of the output signal is improved.

Advantageously, a light-emitting element, such as an LED for example, an incandescent lamp or a light guide, is arranged on the substrate, protruding into the cavity enclosed by the electrically conductive body and/or within an area defined by the sensor surface. Said light-emitting element can be used for identifying the sensor surface or for signaling various switching states of the proximity switch. Furthermore, a marking, e.g. in the form of an imprint, can be applied on the upper side of the cover plate or, in the case of a transparent cover plate, on its lower side for the purpose of identifying the position of the sensor surface.

Preferably, a household appliance, such as for example a washing machine, a laundry dryer, a dishwasher, a cooking appliance, a fume extractor hood, a refrigeration appliance, an air-conditioning appliance, a water heater or a vacuum cleaner, or an input field for a household appliance, is equipped with at least one proximity switch according to the invention. The household appliance can therefore be equipped with a continuous panel encompassing the input field so that the household appliance is protected against an ingress of contamination or humidity. In this respect the panel corresponds to the electrically insulating cover plate and can be manufactured out of glass, glass ceramic, ceramic, plastic, wood or stone for example. Furthermore, the proximity switch according to the invention ensures the appliance's safety since the household appliance is automatically switched off if the operational integrity of the proximity switch is no longer certain.

According to a preferred embodiment, the input field has a plurality of sensor surfaces which are wired in a matrix shape for operating in a multiplex method. Furthermore, the input field can have one or more reference sensor surfaces. The high frequency of the clock signal ensures a sufficient interrogation frequency of the capacitances of the capacitors formed by means of the sensor surfaces and moreover of the reference capacitors for the purpose of determining an actuation by a user. The use of only one clock signal has the advantage that only one clock signal generator is needed.

In a further embodiment, at least two sensor surfaces are arranged adjacent to each other, in particular on the rear side of the cover plate or on a common substrate, and together form a position sensor. Depending on the position relative to the sensor surfaces at which an actuation by the user is detected due to the output signals associated with the sensor surfaces, different switching states can be triggered. By this means, a sliding switch can be formed without elements that have to be shifted mechanically, by the user stroking an area of the cover plate or the panel, which area is allocated to the position sensor, with a finger for example.

Reference is made to the fact that the features of the dependent claims can be combined with one another in any desired way without diverging from the idea according to the invention.

The invention is explained in more detail below with reference to drawings, in which.

Prior to examining the drawings in further detail, it should be noted that corresponding or identical elements or individual parts are designated by the same reference symbols in all the drawing figures in the case of the various embodiments of the capacitive proximity switch according to the invention. If a plurality of elements or individual parts of the same type are used in a drawing, which elements or parts are referred to differently, the same number(s) is(are) selected in each case for the leading place(s) of the corresponding reference symbols. The subsequent places of the corresponding reference symbols serve to differentiate the elements or individual parts of the same type.

Figure 1:
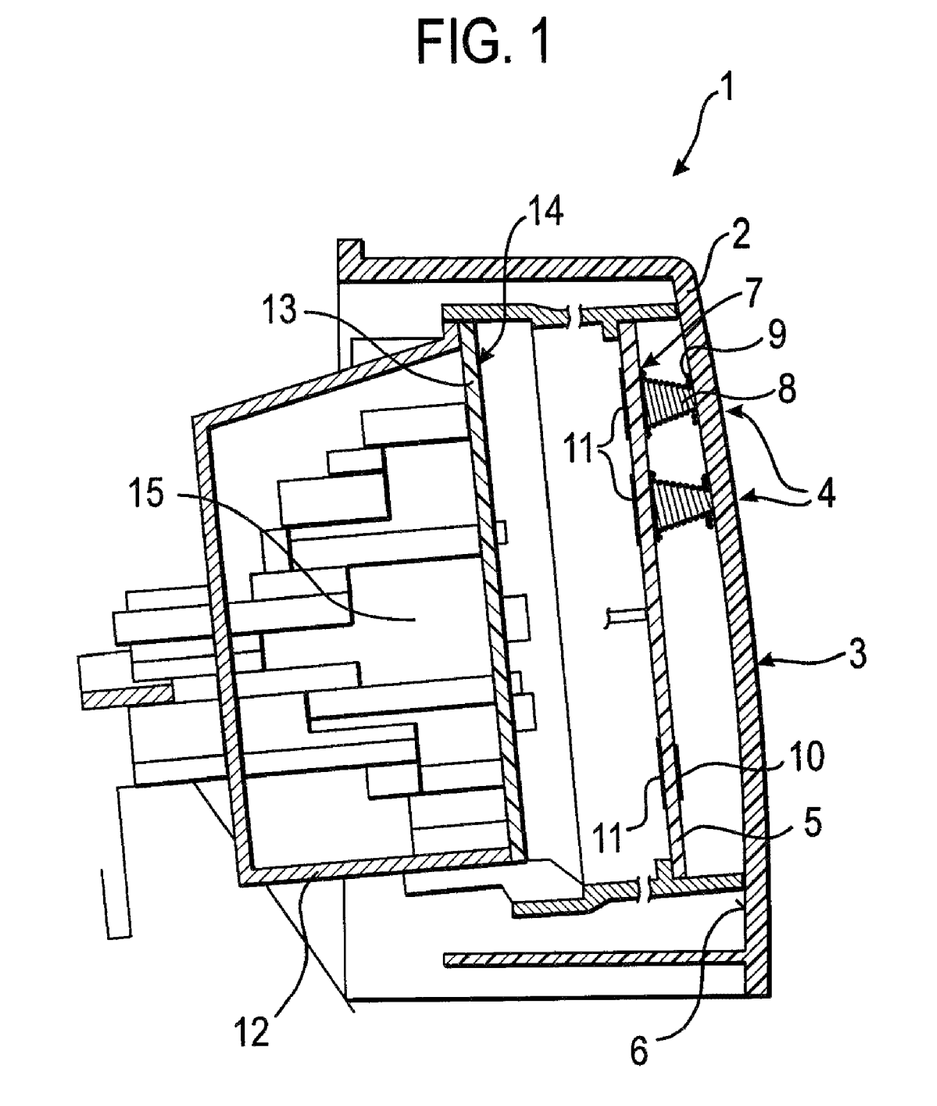
FIG. 1 shows, in a schematic sectional view, a section of a household appliance having a panel that has an input field according to the invention.

FIG. 1 shows, in a schematic sectional view, a section of a household appliance 1 with a panel 2 that has an input field 3 according to the invention. The panel 2 is embodied as an electrically insulating cover plate made out of a dielectric material such as, for example, glass, glass ceramic, ceramic, plastic, wood or stone. The input field 3 contains a plurality of identically constructed capacitive proximity switches 4, only two of which are shown here and just one of which is described in the following. At a distance from the panel 2, a printed circuit board 5 is arranged with an electrically conductive sensor surface 7 facing the rear side 6 of the panel 2. The printed circuit board 5 can be a plastic board that has, on at least one of its sides, the aforementioned sensor surface 7 and where relevant conductor tracks by way of which the sensor surface 7 is connected in an electrically conductive manner to an electrical circuit 14 of the proximity switch 4 (see FIGS. 4, 5 and 6). The electrically conductive layer of the sensor surface 7 can be embodied in various shapes, for example round or angular, with a continuous surface, grid-shaped or frame-shaped.

Arranged between the panel 2 and the printed circuit board 5 is an electrically conductive body in the form of a wound compression spring 8, which is preferably embodied out of spring wire. At its upper end, the compression spring 8 has a flat winding disk 9 that consists of a plurality of windings, which, due to a compressive stress to which the compression spring 8 is subjected, lie within each other in a spiral shape and are matched in a form-fitting manner to the slightly convex shape of the rear side 6 of the panel 2. At its lower end, the compression spring 8 has a lower winding 9' with which it lies flat against the sensor surface 7 of the printed circuit board 5 and is, for example, soldered or adhesively bonded to the sensor surface 7 of the printed circuit board 5 at that point, or with which it simply lies firmly under compressive stress against the sensor surface 7 of the printed circuit board 5 so that an electrically conductive connection exists between the compression spring 8 and the sensor surface 7 of the printed circuit board 5. This electrically conductive connection causes the sensor-related detector property of the sensor surface 7 of the printed circuit board 5 to be displaced to the rear side 6 of the panel 2 and the compression spring 8 for its part then forms at least a part of the sensor surface 7, in particular with its winding disk 9, 9'. Instead of being embodied as a wound compression spring 8 made of metal, the electrically conductive body can also have other shapes, such as cylinder-shaped, cone-shaped or block-shaped for example, and/or be embodied out of other electrically conductive materials such as an electrically conductive plastic or a plastic with a metal core for example.

An electrically conductive reference sensor surface 10 is arranged on the same side of the printed circuit board 5 as that on which the sensor surface 7 is located, that is to say on the front side of the printed circuit board 5 facing the rear side 6 of the panel 2. Like the sensor surface 7, the reference sensor surface 10 is connected in an electrically conductive manner to the circuit 14 of the proximity switch 4. An associated reference sensor surface 10 can be provided for each of the sensor surfaces 7 or one common reference sensor surface 10 for a plurality of, or all of, the sensor surfaces 7. In contrast to the sensor surface 7, the electrically conductive compression spring 8 is absent in the case of the reference sensor surface 10 so that the reference sensor surface 10 is electrically insulated against electrical charges or, as the case may be, changes in charge, at the front side of the panel 2 by means of the air layer between the printed circuit board 5 and the panel 2.

Figure 2:
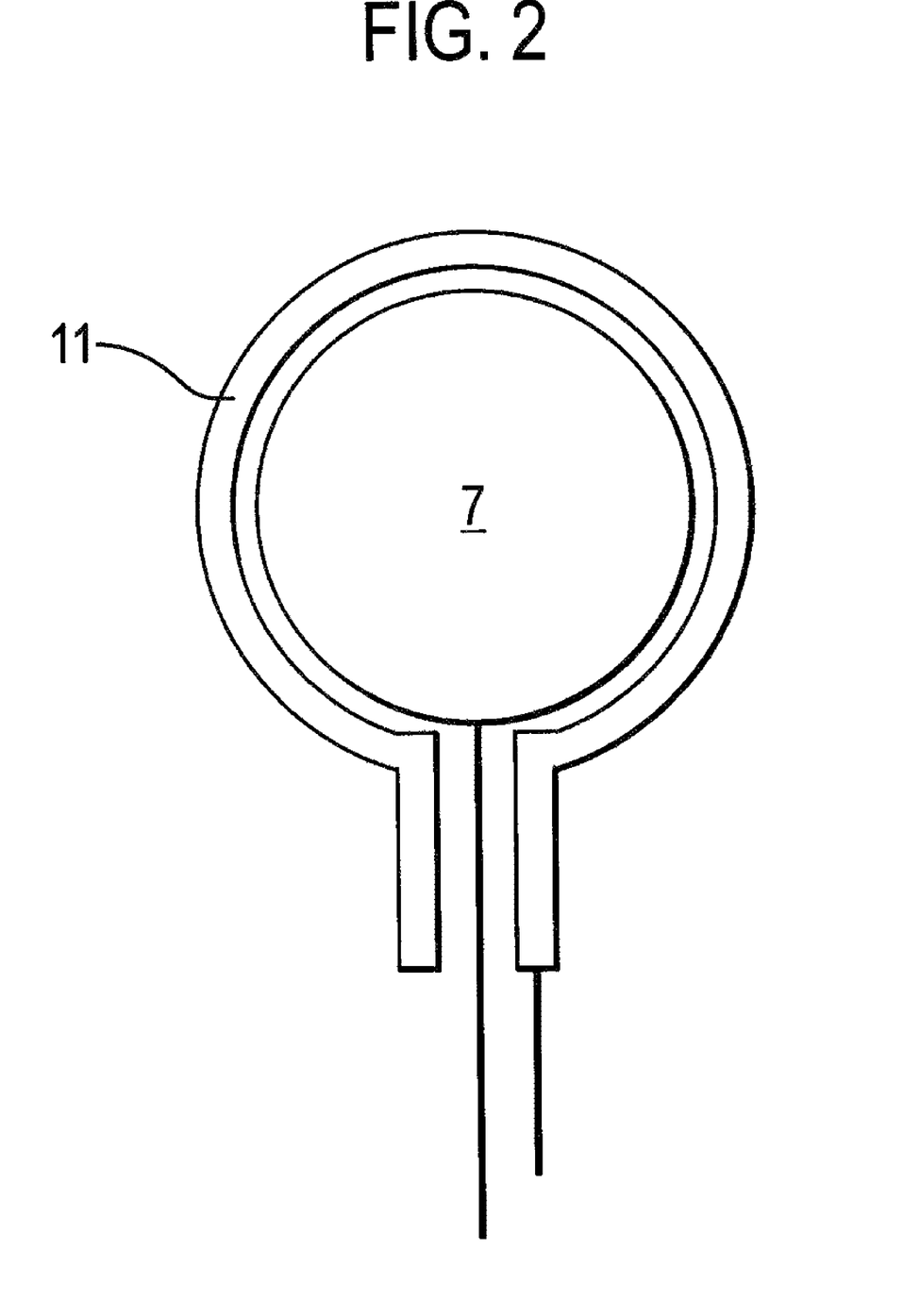
FIG. 2 shows, in a schematic front view, an embodiment of a sensor surface with a screening surface bordering the sensor surface.

On the rear side of the printed circuit board 5, an electrically conductive screening surface 11 is arranged in each case at the position of the sensor surface 7 or the reference sensor surface 10 respectively, the mode of operation of which screening surface is described further below in FIG. 5. In place of individual screening surfaces 11 for each sensor surface 7 or reference sensor surface 10, a single screening surface can be provided that extends over the entire rear side of the printed circuit board 5 or that at least covers the area on the rear side of the printed circuit board 5 that encompasses the sensor surfaces 7 or the reference sensor surface 10. In particular, the printed circuit board 5 can be a flexible printed circuit board or a copper-clad plastic film. In a further alternative embodiment, which is shown in FIG. 2, the sensor surface 7, which is implemented with a round shape in this case, and the screening surface 11 are both located on the front side of the printed circuit board 5. The screening surface 11 is formed in this case by an electrically conductive layer which encloses the sensor surface 7 in a frame shape, the shape of this frame being matched to the outer contour of the sensor surface 7.

The electrical circuit 14 of the proximity switch 4 can be arranged on the front side or rear side of the printed circuit board 5 or on a separate printed wiring board. Furthermore, a common circuit 14 can be provided for a plurality of, or all of, the proximity switches 4. In the embodiment shown in FIG. 1, an electronics module 12 is arranged in the rear area of the printed circuit board 5, which module has a printed wiring board 13 that has the circuit 14 of the proximity switch 4 on its front side facing the printed circuit board 5 and that is populated on its rear side with power electronics 15 of the household appliance 1. This printed wiring board 13 is connected in an electrically conductive manner to the printed circuit board 5 (not shown).

Figure 3A:
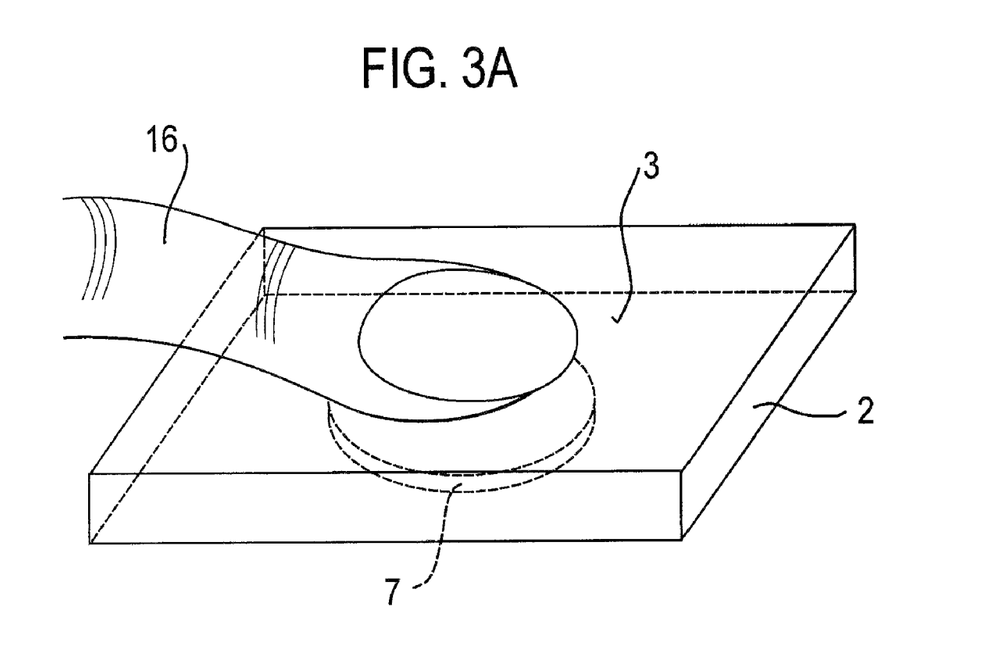
FIGS. 3a, 3b show, in schematic form, a section of the input field as shown in FIG. 1 with an actuation of a capacitive proximity sensor according to the invention by a user.
Figure 3B:
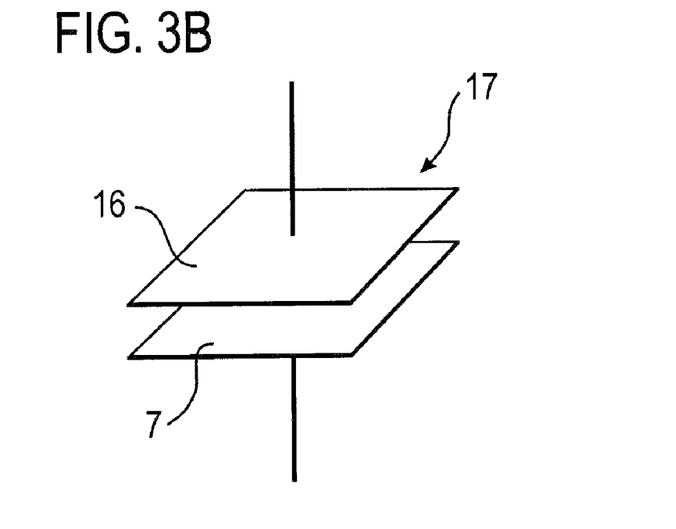

If, as shown in FIG. 3a, an element such as a finger 16 of a user for example, which element or which finger carries a potential that is different from the potential of the sensor surface 7, in particular ground potential, is then moved toward a surface area of the panel 2, which area is situated opposite the sensor surface 7 and/or brought into contact with the said area, then as a result a change in capacitance of a capacitor 17 consisting of the relevant element or the finger 16, the panel 2, and the sensor surface 7 or the sensor surface 7 together with the compression spring 8 is brought about (cf. FIG. 3b). Since the sensor surface 7 is connected in an electrically conductive manner to the circuit 14 of the proximity switch 4, the change in capacitance can be ascertained by means of the circuit 14 and evaluated further for the purpose of triggering a switching signal, as described further below. Furthermore, a light source 35 (cf. FIG. 8), such as an LED for example, can be provided on the printed circuit board 5 in the area within the compression spring 8 in order to identify the sensor surface 7 or signal different switching states of the proximity switch 4.

Figure 4:
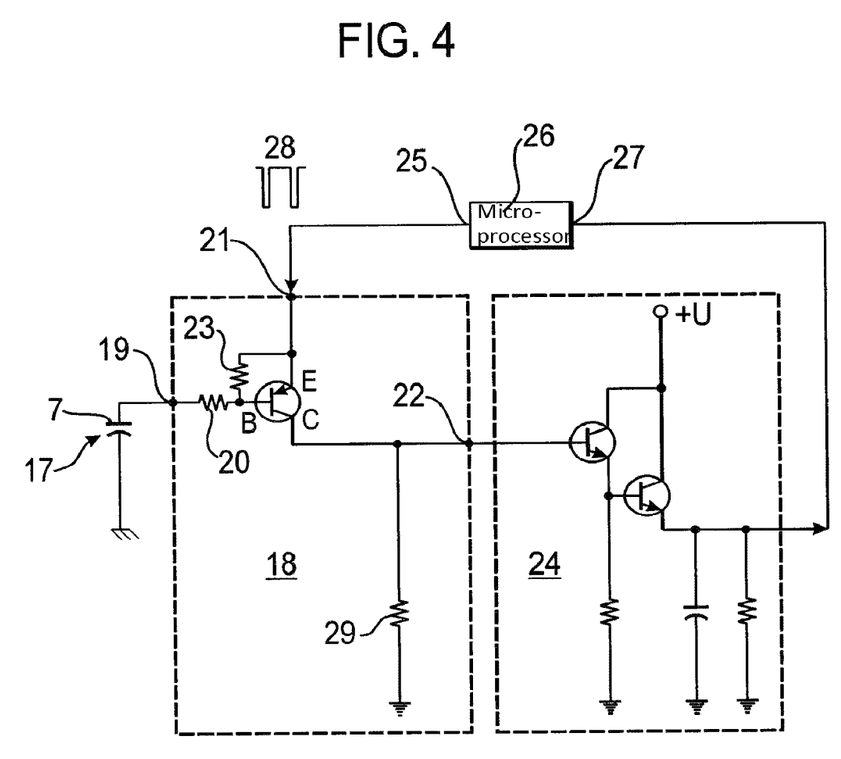
FIG. 4 shows a section of a schematic electrical circuit of the capacitive proximity switch according to the invention.

FIG. 4 shows a section of a circuit diagram of the electrical circuit 14. The circuit 14 has a PNP bipolar transistor as a semiconductor switch 18, to the control input 19 of which, that is to say to the base of which, the sensor surface 7 is connected by way of a current-limiting resistor 20. Moreover, the semiconductor switch 18 has a signal input 21, i.e. the emitter of the PNP bipolar transistor, and a signal output 22, i.e. the collector of the PNP bipolar transistor, the signal input 21 being connected to the sensor surface 7 by way of a base-emitter resistor 23. The current-limiting resistor 20 and the base-emitter resistor 23 can be implemented as being already integrated within the PNP bipolar transistor. For the purpose of further processing of an output signal, the signal output 22 of the semiconductor switch 18 is connected to a sample-and-hold stage 24 of known type, by means of which a dc voltage signal that is proportional to the amplitude of the pulse peaks of the output signal can be made available, and which sample-and-hold stage is not described further here. As an alternative to the sample-and-hold stage 24, the signal output 22 of the semiconductor switch 18 can be connected, for the purpose of processing the output signal, to a known integrator circuit or a known peak-reading voltmeter (not shown). The signal input 21 of the semiconductor switch 18 is connected to an analog signal output 25 of a microprocessor 26 and the signal output 22 of the semiconductor switch 18 is connected, by way of the sample-and-hold stage 24, to an analog signal input 27 of the microprocessor 26. In place of the one microprocessor 26, two different microprocessors can also be used, one of which is connected to the signal input 21 of the semiconductor switch 18 and the other to the signal output 22 of the semiconductor switch 18. In place of the PNP bipolar transistor, other semiconductor switches 18 can also be used, such as, for example, an NPN bipolar transistor, field-effect transistors or generally any controllable semiconductor elements.

A clock signal 28 is present at the signal input 21 of the semiconductor switch 18, which signal is made available for example by the analog signal output 25 of the microprocessor 26. The clock signal 28 is a square-wave, periodic voltage signal, which is switched regularly by the microprocessor 26 between ground potential, i.e. LOW level, and the operating voltage of the circuit 14 of the proximity switch 4, i.e. HIGH level, it being possible for the ground potential to be different from the ground potential of the user. The clock frequency of the clock signal 28 preferably lies in the range between 10 and 100 kilohertz. The signal output 22 of the semiconductor switch 18, that is to say the collector of the PNP bipolar transistor, lies, by way of a further resistor 29, at the reference potential of the sample-and-hold stage 24. With the LOW level of the clock signal 28, the signal input 21 of the semiconductor switch 18, and therefore the emitter E of the PNP bipolar transistor and also the base-emitter resistor 23, is set to ground potential. This results in the sensor surface 7 or the capacitor 17 being discharged by way of the current-limiting resistor 20 and the base-emitter resistor 23. As a result, the base B of the PNP bipolar transistor becomes positive with respect to the emitter E of the PNP bipolar transistor and the PNP bipolar transistor blocks the current flow. With the HIGH level of the clock signal 28, following after the LOW level, the sensor surface 7, and therefore the capacitor 17, is charged up by way of the base-emitter resistor 23 and the current-limiting resistor 20. During this charge-up time of the sensor surface 7 or, as the case may be, the capacitor 17 there is a voltage drop at the base-emitter resistor 23. As a result, the base B of the PNP bipolar transistor becomes negative with respect to the emitter E and the PNP bipolar transistor becomes conducting and connects through until the sensor surface 7 or the capacitor 17 is charged up to the HIGH level of the clock signal 28. During this charge-up time of the sensor surface 7 or the capacitor 17 by the clock signal 28, an output signal is present at the resistor 29 that is proportional to the capacitance of the sensor surface 7 or the capacitor 17. Thus, there is present at the signal output 22 of the semiconductor switch 18 an output signal which follows the clock signal 28 and the signal components of which are proportional to the capacitance of the sensor surface 7 or the capacitor 17.

This output signal is converted into a dc voltage signal by means of the sample-and-hold stage and is present at the analog signal input 27 of the microprocessor 26. The microprocessor 26 is embodied for evaluating a change over time of signal components of the dc voltage signal and therefore of the output signal with the aid of a software program for example. An actuation of the proximity switch 4 is detected by the microprocessor 26 as a function of how quickly the signal components of the output signal, such as, for example, the height of the pulse peak or the pulse width, of successive clock periods change. That is to say if the signal components change within a predefined time of one second for example, this is detected as an actuation, while if the signal components change more slowly, there is no actuation present. By this means, the determination of an actuation of the proximity switch 4 is independent of the absolute value of the output signal, which eliminates long-term changes thereof, e.g. due to aging processes.

Figure 5:
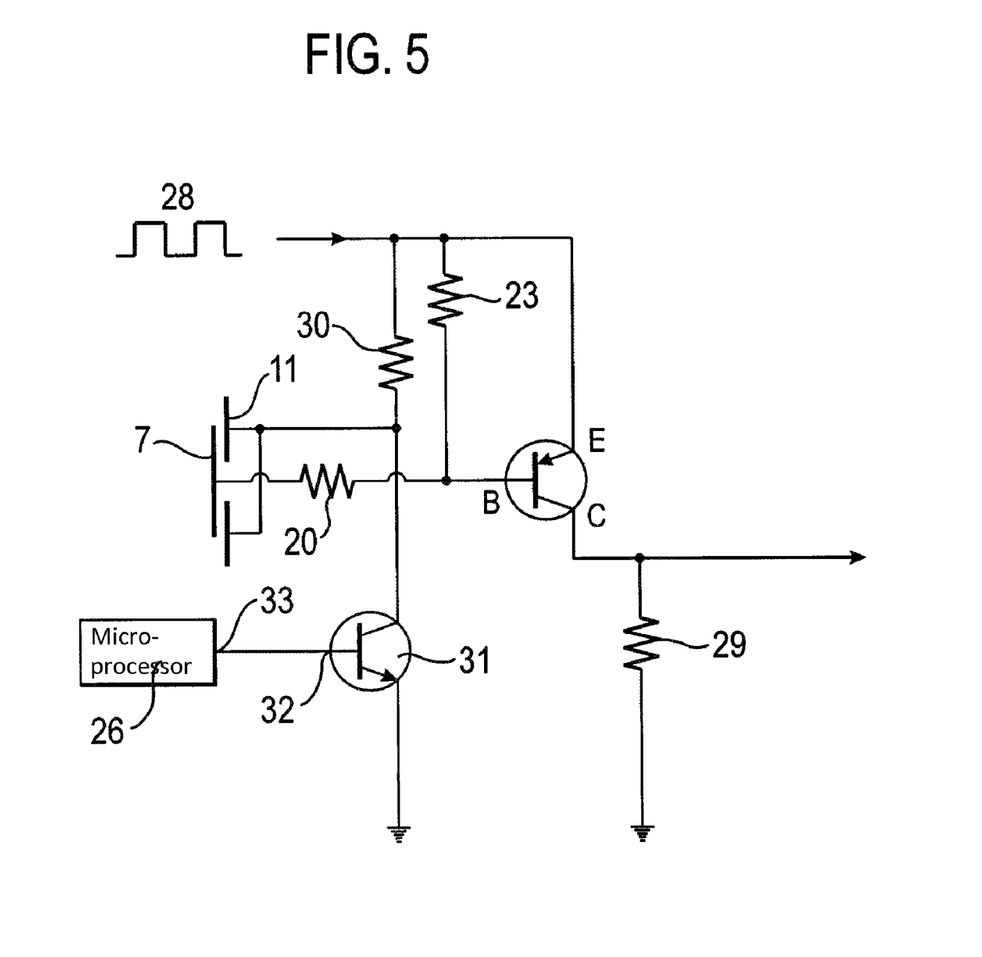
FIG. 5 shows a section of a schematic electrical circuit of the proximity switch according to the invention with active screening.

FIG. 5 shows a section of the electrical circuit 14 of the proximity switch 4 according to the invention with active screening. The active screening is formed by the screening surface 11, which is connected to the signal input 21 of the semiconductor switch 18 by way of a low-impedance resistor 30, and at which, at the same time as at the sensor surface 7, the clock signal 28 is applied by way of said low-impedance resistor 30. Suitable selection of the low-impedance resistor 30 makes it possible to match the shape of the clock signal 28 at the screening surface 11 to the shape of the clock signal 28 at the sensor surface 7 so that no difference in potential and therefore no shift of charge carriers occurs between the screening surface 11 and the sensor surface 7 and consequently the screening of the sensor surface 7 by the screening surface 11 against parasitic capacitances is ensured.

The screening surface 11 is connected to ground for the purpose of applying ground potential by way of a switch 31, which in the embodiment shown here is an NPN bipolar transistor. The switch 31 has a control signal input 32, specifically the base of the NPN bipolar transistor, which is connected to a control signal output 33 of the microprocessor 26. The switch 31 or the NPN bipolar transistor can therefore be switched in a simple manner by means of a software program of the microprocessor 26. For the purpose of function testing of the proximity switch 4, i.e. in order to ascertain a reference value of the output signal, the screening surface 11 is temporarily connected to ground potential by the switch 31, as a result of which the active screening is temporarily disabled and an actuation of the proximity switch 4 is simulated. By this means it is possible to check whether there is a sufficient deviation of the output signal upon actuation of the proximity switch 4 or whether there is a malfunction, possibly due to contamination or wetting of the panel 2, due to ambient conditions such as temperature and humidity, or due to aging processes of the proximity switch 4. The deviation of the output signal can possibly be adjusted dynamically by changing the height of the clock signal 28, i.e. the proximity switch 4 can be calibrated automatically, which improves the functional reliability of the proximity switch 4. If, due to a contaminated panel 2 for example, reliable functioning of the proximity switch is no longer assured, the household appliance 1 is automatically switched off.

The reference sensor surface 10 is connected in a corresponding manner to the sensor surface 7. The reference sensor surface 10 is arranged adjacent to the sensor surface 7 so that the capacitance of the reference sensor surface 10 or an open-type reference capacitor formed by means of the reference sensor surface 10 constitutes a measure for the ambient conditions, i.e. the parasitic capacitances, of the sensor surface 7, but also a measure for the influence of temperature, humidity, or changes in materials due to aging, on the output signal. The same clock signal 28 is present at the reference sensor surface 10 as at the sensor surface 7, in particular in a time-division multiplex method. That is to say the sensor surface 7 and the reference sensor surface 10 are supplied one after the other with different periods of the same clock signal 28. As an alternative thereto, a further clock signal from a further analog signal output of the microprocessor 26 can also be applied to the reference sensor surface 10. The reference signal generated by the reference sensor surface 10 is taken into account as the fundamental level of the output signal during the evaluation of the output signal that is generated by the sensor surface 7 in the microprocessor 26, and is therefore used for the determination of an actuation state of the proximity switch 4. In the case of household appliances 1 that are switched on with a power switch, it is established with the aid of the reference signal as early as during switching on whether there is an actuation of the proximity switch 4.

Figure 6:
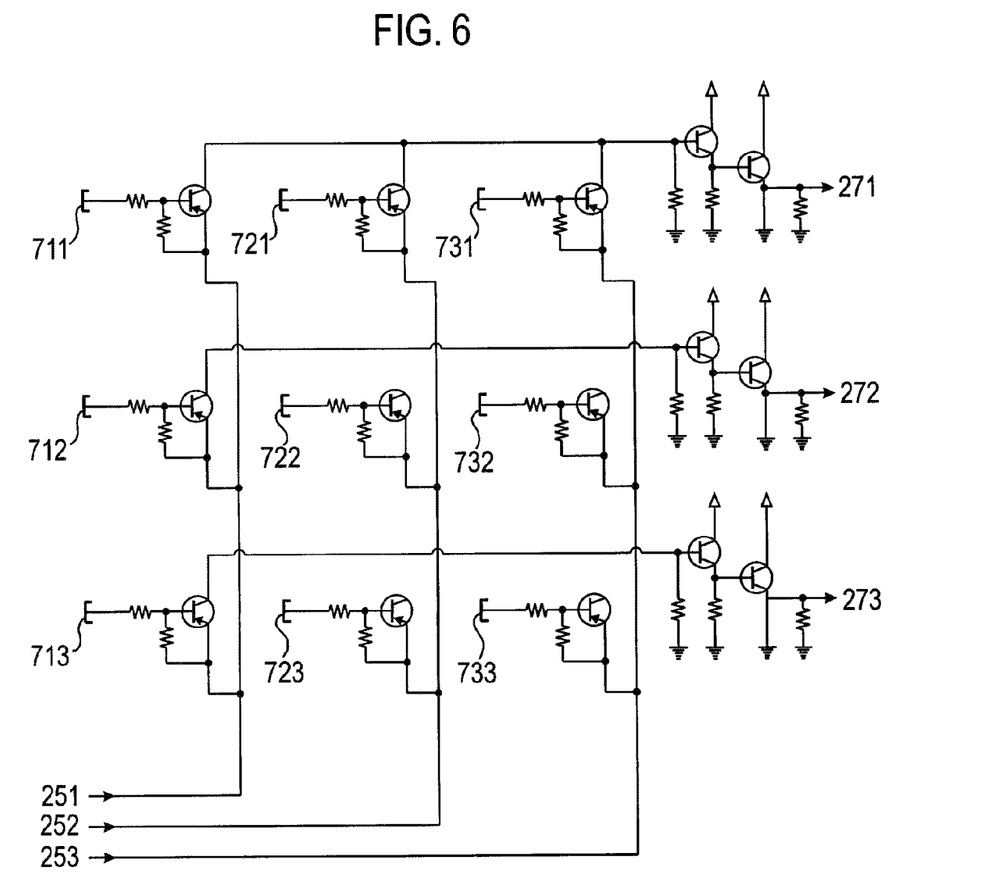
FIG. 6 shows a schematic circuit of the input field as shown in FIG. 1 with a plurality of proximity switches according to the invention connected in a matrix shape.

FIG. 6 shows a schematic circuit 14 of the input field 3, with nine proximity switches 4 according to the invention wired up in a three-by-three matrix shape, for the purpose of operating in a time-division multiplex method. The sensor surfaces 711, 712, 713 of the first three proximity switches are connected to a first signal output 251 of the microprocessor 26. The sensor surfaces 721, 722 and 723 of the second three proximity switches are connected to a second signal output 252 of the microprocessor 26. The sensor surfaces 731, 732 and 733 of the third three proximity switches are connected to a third signal output 253 of the microprocessor 26. The sensor surfaces 711, 721 and 731 are connected by way of their respectively associated semiconductor switch and a first sample-and-hold stage to a first signal input 271 of the microprocessor 26. The sensor surfaces 712, 722 and 732 are connected by way of their respectively associated semiconductor switch and a second sample-and-hold stage to a second signal input 272 of the microprocessor 26. The sensor surfaces 713, 723 and 733 are connected by way of their respectively associated semiconductor switch and a third sample-and-hold stage to a third signal input 273 of the microprocessor 26.

The clock signal 28 is output for a predefined time in each case, i.e. for a predefined number of clock periods, by one of the three signal outputs 251, 252 and 253 of the microprocessor 26. In this respect the signal outputs 251, 252 and 253 act in turn one after the other, which process is repeated on a cyclical basis. During the time in which the clock signal 28 is output by one of the three signal outputs 251, 252 and 253, all three signal inputs 271, 272 and 273 of the microprocessor 26 are evaluated in each case. By this means all nine sensor surfaces 711, 712, 713, 721, 722, 723, 731, 732 and 733 can be checked one after another with only one circuit to see whether there is an actuation of the corresponding proximity switch by a user.

Figure 7:
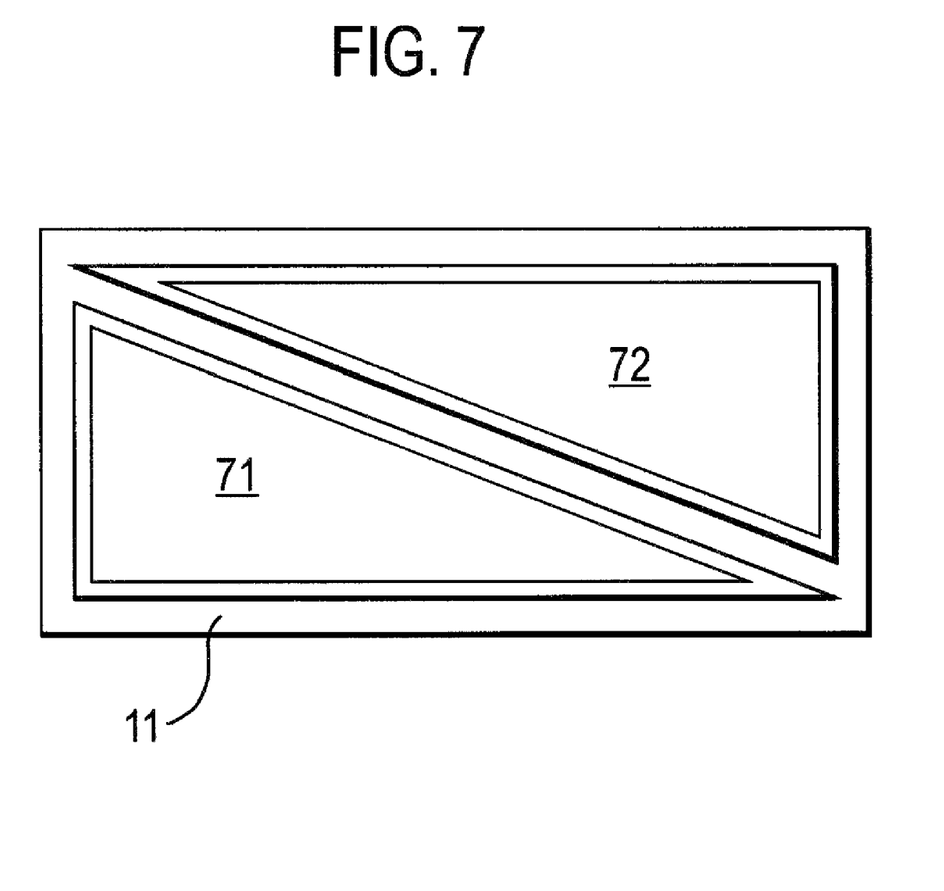
FIG. 7 shows, in a schematic front view, an embodiment of two sensor surfaces that form a position sensor.

FIG. 7 shows, in a schematic front view, an embodiment of two sensor surfaces 71 and 72, which together form a position sensor. The sensor surfaces 71 and 72 are embodied in the form of right-angled triangles and are arranged adjacent to each other on a common substrate 5 or on the rear side of the panel 2, the respective hypotenuse of the sensor surfaces 71 and 72 being situated opposite the other. The sensor surfaces 71 and 72 are bordered by a common screening surface 11 which extends along the hypotenuse of the triangles between the sensor surfaces 71, 72. As a function of the position relative to the lateral extent of the sensor surfaces 71, 72 at which an actuation is effected by the user, where the user touches the panel 2 in the area of the sensor surfaces 71, 72 and therefore of the position sensor, the capacitance of the capacitors formed by means of the sensor surfaces 71, 72 is different due to the triangular shape of the sensor surfaces 71, 72. The position of the actuation can therefore be determined on the basis of the output signals associated with the sensor surfaces 71, 72 and therefore a switching state corresponding to or allocated to this position can be triggered. In the case of a change or shift in the actuation position, where the user shifts his finger on the panel 2 for example, this change is likewise detected and where relevant a switching state corresponding to the new position is triggered. In this way the position sensor forms a sliding switch without elements requiring to be shifted mechanically, by means of which, for example, a temperature or an output in the case of a cooker hob, an air-conditioning appliance or a refrigeration appliance can be set.

Figure 8:
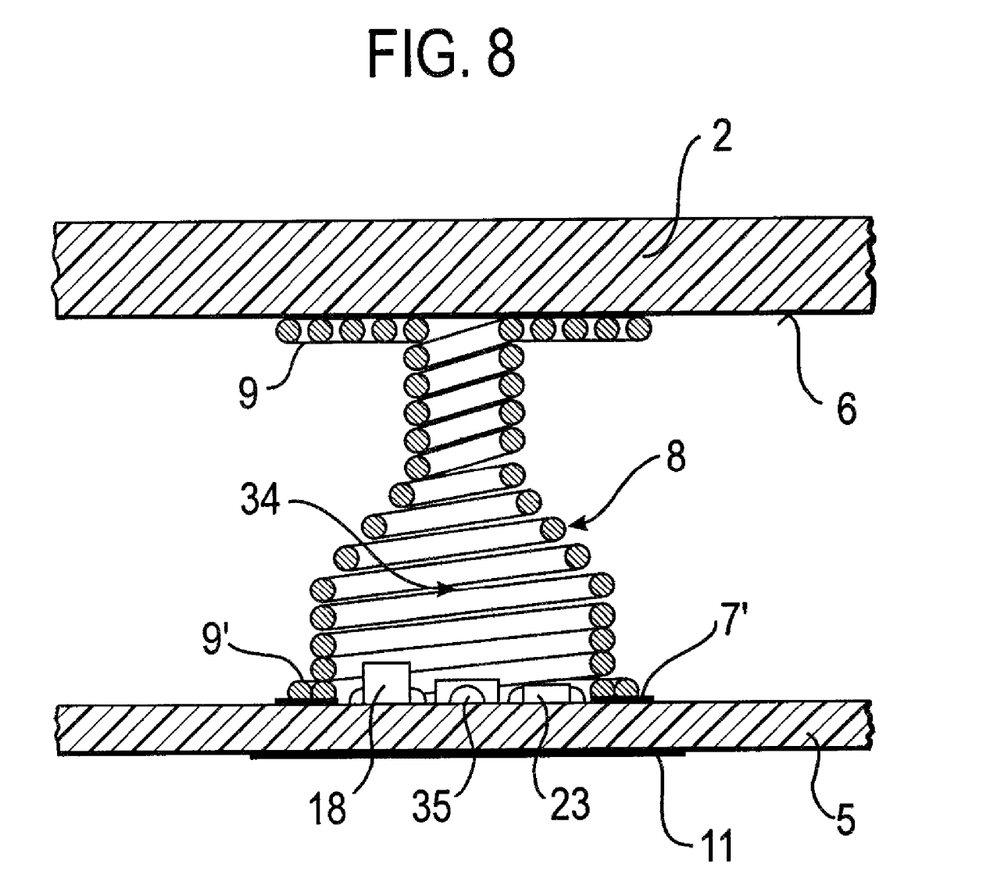
FIG. 8 shows, in a schematic side view, a section of the input field as shown in FIG. 1 with electronic components of the electrical circuit as shown in FIG. 4 that protrude into a cavity enclosed by a compression spring.

FIG. 8 shows, in a schematic sectional view, a section of the input field as shown in FIG. 1. A solder ring 7' is applied to the printed circuit board 5 with which the winding disk 9' formed by the lower two windings of the wound compression spring 8 is soldered to the printed circuit board 5 and by this means connected to the electrical circuit 14. The compression spring 8 encloses a cavity 34 with its windings. On the printed circuit board 5, the PNP bipolar transistor of the semiconductor switch 18, with its base-emitter resistor 23 and its current-limiting resistor 20, and also a light-emitting diode 35 are arranged within the solder ring 7' on the side of the electronic components of the electrical circuit 14 facing the cover plate 2, and protrude into the cavity 34 enclosed by the compression spring 8. In order to enable an electrical connection of these electronic components to the further components of the electrical circuit 14, the solder ring 7' is not an entirely closed ring but instead is interrupted at the side (not shown). As an alternative thereto, the electrical connection can also be effected through the printed circuit board 5. Together with the screening surface 11 arranged on the rear side of the printed circuit board 5, the compression spring 8 forms a Faraday cage for the electronic components arranged in the inner area 34 of the compression spring 8 so that the said components are screened against electromagnetic fields from the environment.

LIST OF REFERENCE SYMBOLS

1 Household appliance
2 Panel
3 Input field
4 Proximity switch
5 Printed circuit board
6 Rear side of the panel
7 Sensor surface
7' Solder ring
8 Compression spring
9 Winding disk for the upper windings
9' Winding disk for the lower windings
10 Reference sensor surface
11 Screening surface
12 Electronics module
13 Printed wiring board
14 Circuit of the proximity switch
15 Power electronics
16 Finger of the user
17 Capacitor
18 Semiconductor switch
19 Control input of the semiconductor switch
20 Current-limiting resistor
21 Signal input of the semiconductor switch
22 Signal output of the semiconductor switch
23 Base-emitter resistor
24 Sample-and-hold stage
25 Analog signal output of the microprocessor 26 Microprocessor
27 Analog signal input of the microprocessor
28 Clock signal
29 Resistor
30 Low-impedance resistor
31 Switch
32 Control signal input of the switch
33 Control signal output of the microprocessor
34 Cavity enclosed by the compression spring
35 Light-emitting diode

The invention claimed is:

1. A capacitive proximity switch, comprising:
an electrically insulating cover plate;
an electrically conductive sensor surface covered by said electrically insulating cover plate and serving as part of a capacitor having a capacitance that varies with proximity;
a semiconductor switch having a control input connected to said sensor surface, a signal input having a clock signal, and a signal output carrying an output signal following the clock signal, the output signal having signal components proportional to the capacitance of the capacitor formed with said sensor surface;
a microprocessor having an analog input connected to said signal output of said semiconductor switch for evaluating the output signal, said microprocessor being configured to evaluate a change over time of signal components of the output signal, and to detect an actuation of the proximity switch in dependence on how quickly the signal components of the output signal of successive clock periods change.

2. The proximity switch according to claim 1, wherein said control input is configured for supplying said sensor surface with the clock signal, and the output signal is present at said signal output of said semiconductor switch during a charge-up time of the capacitor by way of the clock signal.

3. The proximity switch according to claim 1, wherein said semiconductor switch has a transistor with a base, and said sensor surface is connected to said base of said transistor.

4. The proximity switch according to claim 1, wherein for the purpose of supplying with the clock signal the signal input is connected to an output of a microprocessor.

5. The proximity switch according to claim 1, wherein the clock signal is a periodic clock signal.

6. The proximity switch according to claim 1, wherein the clock signal is a square wave signal.

7. The proximity switch according to claim 1, wherein the clock signal has a frequency in a range from 10 to 100 kilohertz.

8. The proximity switch according to claim 7, wherein the frequency of the clock signal is an automatically variable signal.

9. The proximity switch according to claim 1, wherein the clock signal is applied cyclically at said signal input for a predefined period of time in each case.

10. The proximity switch according to claim 1, wherein said signal output of said semiconductor switch is connected, for the purpose of processing the output signal, to an integrator circuit or a peak-reading voltmeter or a sample-and-hold circuit.

11. The proximity switch according to claim 1, wherein said sensor surface includes an active screening formed by a screening surface carrying the clock signal simultaneously with said sensor surface.

12. The proximity switch according to claim 11, wherein the clock signal is applied to said screening surface by way of a low-impedance resistor.

13. The proximity switch according to claim 11, which comprises a switch connected between said screening surface and ground, for applying ground potential to said screening surface by way of said switch.

14. The proximity switch according to claim 13, wherein said switch has a control signal input connected to a control signal output of said microprocessor.

15. The proximity switch according to claim 13, wherein said switch is a transistor.

16. The proximity switch according to claim 11, wherein said screening surface and said sensor surface are formed on a rear side of said cover plate, and said screening surface encloses said sensor surface.

17. The proximity switch according to claim 11, which comprises a substrate, and wherein said screening surface and said sensor surface are commonly disposed on a given side of said substrate, and said screening surface encloses said sensor surface.

18. The proximity switch according to claim 11, which comprises a substrate having a front side and a rear side, and wherein said sensor surface is disposed on said front side of said substrate and said screening surface is disposed on said rear side of said substrate, at least in an area occupied by said sensor surface.

19. The proximity switch according to claim 17, wherein said substrate is disposed at a spacing distance from said cover plate and an electrically conductive body is disposed between said cover plate and said substrate, wherein said body spans said spacing distance and is electrically connected to said sensor surface and/or forms at least a part of said sensor surface with at least a portion of a surface thereof.

20. The proximity switch according to claim 17, wherein said substrate is a flexible printed circuit board or a copper-clad plastic film.

21. The proximity switch according to claim 14, which comprises a reference sensor surface for generating a reference signal for determining an actuation state of the proximity switch, wherein signal components of the reference signal are proportional to a capacitance of a reference capacitor formed with said reference sensor surface, and wherein the capacitance of the reference capacitor is determined by ambient conditions of said sensor surface.

22. The proximity switch according to claim 21, which comprises a substrate carrying said reference sensor surface and said sensor surface.

23. The proximity switch according to claim 22, wherein said reference sensor surface and said sensor surface are commonly disposed on one side of said substrate.

24. The proximity switch according to claim 22, wherein said substrate is disposed at a spacing distance from said cover plate and an electrically conductive body is disposed between said cover plate and said substrate, wherein said body spans said spacing distance and is electrically connected to said sensor surface and/or forms at least a part of said sensor surface with at least a portion of a surface thereof.

25. The proximity switch according to claim 21, wherein the clock signal is present at said sensor surface and at said reference sensor surface.

26. The proximity switch according to claim 21, wherein the clock signal is present at said sensor surface and a further, different clock signal is present at said reference sensor surface.

27. The proximity switch according to claim 21, wherein the clock signal is present at said sensor surface and at said reference sensor surface in a time-division multiplex method.

28. An input field for a household appliance, comprising at least one proximity switch according to claim 1.

29. A household appliance, comprising an input field with at least one proximity switch according to claim 1.

30. A capacitive proximity switch, comprising:
an electrically insulating cover plate and an electrically conductive sensor surface covered by said cover plate and forming a part of a capacitor having a capacitance that varies with proximity;
a semiconductor switch having a control input connected to said sensor surface, a signal input having a clock signal, and a signal output carrying an output signal following the clock signal, the output signal having signal components proportional to the capacitance of the capacitor formed with said sensor surface;
said sensor surface having active screening formed by a screening surface carrying the clock signal simultaneously with said sensor surface.

31. The proximity switch according to claim 30, wherein the clock signal is applied to said screening surface by way of a low-impedance resistor.

32. The proximity switch according to claim 30, which comprises a switch connected between said screening surface and ground, for applying ground potential to said screening surface by way of said switch.

33. The proximity switch according to claim 32, wherein said switch has a control signal input connected to a control signal output of a microprocessor.

34. The proximity switch according to claim 32, wherein said switch is a transistor.

35. The proximity switch according to claim 30, wherein said screening surface and said sensor surface are formed on a rear side of said cover plate, and said screening surface encloses said sensor surface.

36. The proximity switch according to claim 30, which comprises a substrate, and wherein said screening surface and said sensor surface are commonly disposed on a given side of said substrate, and said screening surface encloses said sensor surface.

37. The proximity switch according to claim 30, which comprises a substrate having a front side and a rear side, and wherein said sensor surface is disposed on said front side of said substrate and said screening surface is disposed on said rear side of said substrate, at least in an area occupied by said sensor surface.

38. The proximity switch according to claim 36, wherein said substrate is disposed at a spacing distance from said cover plate and an electrically conductive body is disposed between said cover plate and said substrate, wherein said body spans said spacing distance and is electrically connected to said sensor surface and/or forms at least a part of said sensor surface with at least a portion of a surface thereof.

39. The proximity switch according to claim 36, wherein said substrate is a flexible printed circuit board or a copper-clad plastic film.

40. The proximity switch according to claim 30, which comprises a reference sensor surface for generating a reference signal for determining an actuation state of the proximity switch, wherein signal components of the reference signal are proportional to a capacitance of a reference capacitor formed with said reference sensor surface, and wherein the capacitance of the reference capacitor is determined by ambient conditions of said sensor surface.

41. The proximity switch according to claim 40, which comprises a substrate carrying said reference sensor surface and said sensor surface.

42. The proximity switch according to claim 41, wherein said reference sensor surface and said sensor surface are commonly disposed on one side of said substrate.

43. The proximity switch according to claim 41, wherein said substrate is disposed at a spacing distance from said cover plate and an electrically conductive body is disposed between said cover plate and said substrate, wherein said body spans said spacing distance and is electrically connected to said sensor surface and/or forms at least a part of said sensor surface with at least a portion of a surface thereof.

44. The proximity switch according to claim 40, wherein the clock signal is present at said sensor surface and at said reference sensor surface.

45. The proximity switch according to claim 40, wherein the clock signal is present at said sensor surface and a further, different clock signal is present at said reference sensor surface.

46. The proximity switch according to claim 40, wherein the clock signal is present at said sensor surface and at said reference sensor surface in a time-division multiplex method.

47. An input field for a household appliance, comprising at least one proximity switch according to claim 30.

48. A household appliance, comprising an input field with at least one proximity switch according to claim 30.

* * * * *